United States Patent [19]

Amazawa et al.

[11] 4,189,679
[45] Feb. 19, 1980

[54] NOISE DETECTING CIRCUIT HAVING NOISE-IMMUNE AGC

[75] Inventors: Kiyoshi Amazawa; Masaharu Mori, both of Toda, Japan

[73] Assignee: Clarion Co., Ltd., Tokyo, Japan

[21] Appl. No.: 848,494

[22] Filed: Nov. 4, 1977

[30] Foreign Application Priority Data

Nov. 8, 1976 [JP] Japan ................................. 51/133878
Nov. 17, 1976 [JP] Japan ................................. 51/137908

[51] Int. Cl.$^2$ ............................................. H04B 1/10
[52] U.S. Cl. .................................... 325/474; 325/479; 325/480
[58] Field of Search ............... 325/402, 403, 348, 473, 325/477–480, 324, 474; 328/167; 358/167

[56] References Cited

U.S. PATENT DOCUMENTS

| | | | |
|---|---|---|---|
| 3,241,073 | 3/1966 | Hummel | 325/473 |
| 3,339,144 | 8/1967 | Squires | 325/402 |
| 3,624,288 | 11/1971 | Hofmann | 325/479 |
| 4,042,959 | 8/1977 | Klein | 358/167 |

Primary Examiner—John C. Martin
Attorney, Agent, or Firm—Wallenstein, Spangenberg, Hattis & Strampel

[57] ABSTRACT

In an audio reproducing system including mixer means, intermediate frequency transformer means, first gate means and audio reproducing means following said first gate means, a noise detecting circuit comprising detector means for detecting a high frequency component of the output signal of said mixer means; amplifier means for amplifying a signal having said high frequency component from said detector means; pulse generator means for producing a pulse in response to a noise component in the output of said amplifier means; automatic gain control means for controlling the gain of said amplifier means, second gate means provided between said automatic gain control means and said amplifier means; and means for applying said pulse to said first and second gate means to operate them to thereby prevent application of said noise component to said audio reproducing means.

4 Claims, 6 Drawing Figures

NOISE DETECTING CIRCUIT HAVING
NOISE-IMMUNE AGC

BACKGROUND OF THE INVENTION

This invention relates to a noise detecting circuit adapted to be incorporated into an audio receiver or the like, and more particularly, to a noise detecting circuit that detects incoming of amplitude modulated waves that contain pulse-shaped noise signals and generates switching signals for controlling a gate circuit by breaking, for example, the main signal path between intermediate frequency transformers and eliminating the noise signals.

Generally speaking, upon receiving amplitude modulated waves, a change in the level of input electric field causes a far greater change in the level of audio output than upon receiving of frequency modulated waves. Therefore, even a relatively low level of pulse-shaped noise results in a low signal to noise (S/N) ratio depending upon the strength of electric field.

However, the conventional noise detecting circuit is based on the fact that pulse-shaped noise like that produced from a vehicle or car contains a high frequency component that lasts for a considerable long period of time, and produces a detector output higher than the average level of the desired signals removes any high frequency component from the detector amplitude of such high frequency, and when the signals reaches a certain level, the noise detecting circuit generates a control pulse signal that indicates detection of the noise. Accordingly, the conventional noise detecting circuit is only capable of detecting a relatively high level of pulse-shaped noise and is unable to detect a relatively low level of pulse-shaped noise that has, as mentioned above, substantially reduces the S/N ratio.

As for the noise eliminating circuit of FM stereo receiver, since noise contains a high frequency component, a high-pass filter is conventionally used to detect a component having a higher frequency than the desired FM frequency band, namely, higher than 75 KHz, a maximum modulated frequency of an FM stereo signal. The effect of eliminating noise can only be improved by ensuring detection of not only a high frequency component of noise but a low frequency component as well, but as mentioned above, the conventional noise detecting system has been unable to detect a low amplitude component of noise, although detection of such component is absolutely required for avoiding erroneous detection of a modulated signal frequency component.

SUMMARY OF THE INVENTION

The invention provides a highly sensitive noise detecting circuit that is capable of detecting not only a relatively high level of pulse-shaped noise but a low level of pulse-shaped noise as well.

The invention also preferably provides an extremely high sensitive noise detecting circuit that assures detection of a noise signal regardless of the level of an incoming frequency modulated signal.

DETAILED DESCRIPTION OF THE PREFERRED EMBODIMENTS

Figure 1:
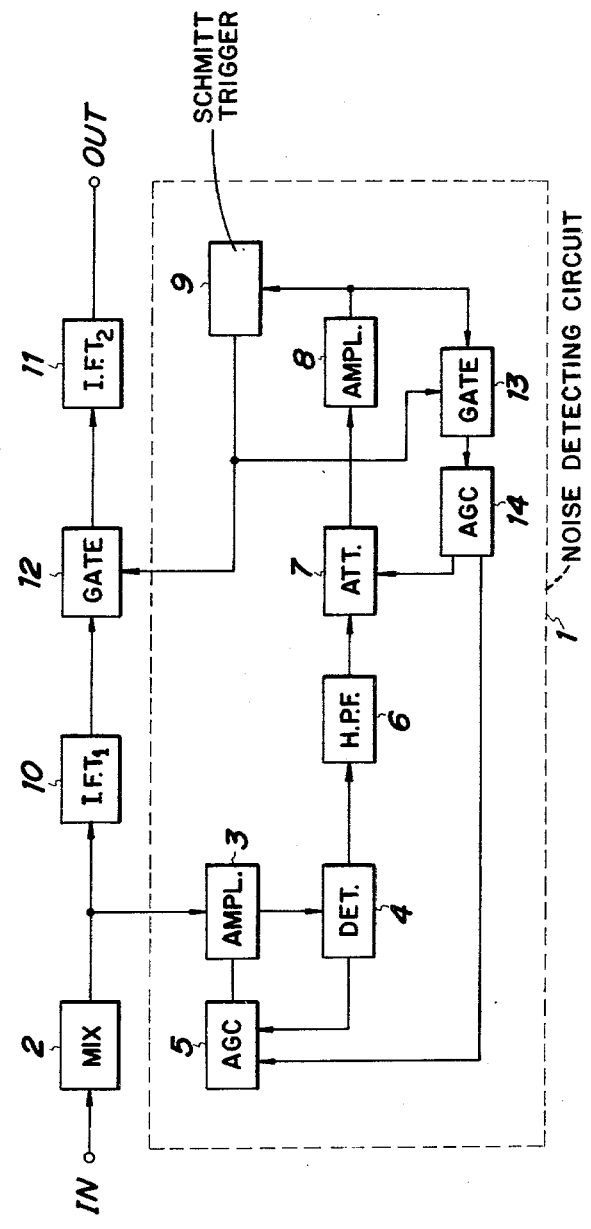
FIG. 1 is a block diagram showing one embodiment of the noise detecting circuit according to this invention.
Figure 2:
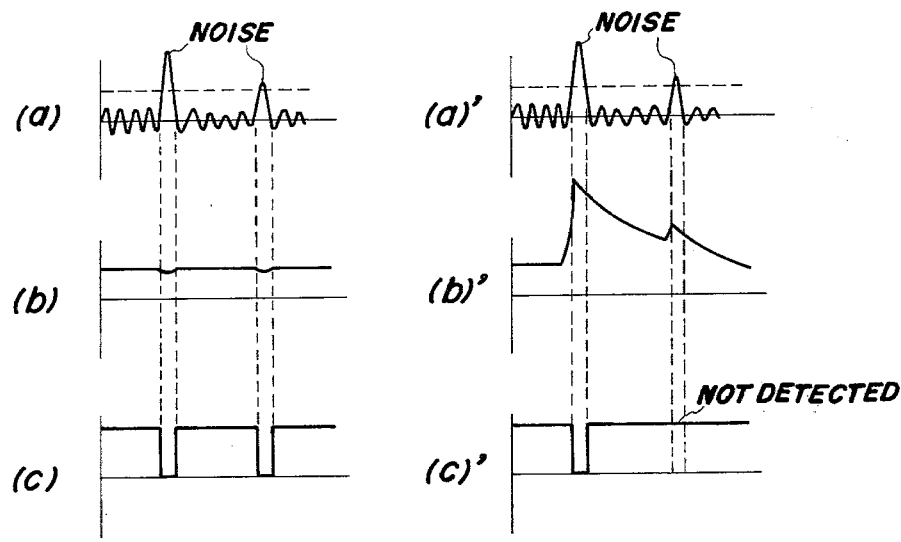
FIG. 2 describes waveforms that illustrate the operation of this circuit.

This invention is now explained by referring to FIGS. 1 and 2.

FIG. 1 is a block diagram showing the circuit of this invention as incorporated into an AM receiver. In this figure, the broken line is especially used to indicate a noise detecting circuit 1. Since the AM receiver used in this circuit is of a conventional type, only the blocks that are necessary to explain this invention are shown.

As incoming signal from a mixer (MIX) 2 is amplified by a first amplifier 3 that serves as a wide band amplifier, and detected by an audio detector 4. If the incoming signal is too strong, the input to the detector 4 is suppressed to be at an almost constant level by an automatic gain control circuit (AGC) 5 for the first amplifier 3. Since the output of the detector 4 is connected to a second amplifier 8 through a high-pass filter (H.P.F.) 6 and an attenuator (ATT) 7, a high frequency component is taken out of the detected audio signal and amplified. If a pulse-shaped noise as a high frequency component is contained in the incoming signal, a noise signal component having an amplitude abnormally higher than that of a peripheral signal level appears at the output of the second amplifier 8. If the operation level of a pulse generator circuit, for example, a Schmitt trigger circuit 9, is preset at the level capable of detecting this noise signal component, the Schmitt trigger circuit 9 generates a switching pulse in response to an arrival of the noise signal component thereto. The switching pulse generated by the Schmitt trigger circuit 9 actuates a first gate circuit 12 disposed between intermediate frequency transformers 10 and 11 (IFT$_1$ and IFT$_2$) on the main signal path so that the incoming signal that contains noise may not pass from IFT$_1$ to IFT$_2$. At the same time, in order that the level of a continuous output of the noise signal component from the second amplifier may substantially exceed the operation level of the Schmitt trigger circuit 9 with adverse effects, the switching pulse, as long as the noise exists, closes a second gate circuit 13 and prevents inputing to an AGC circuit 14 of the noise signal component that has been amplified by the second amplifier 8 so that the circuit remains sensitive to low amplitude noise signals. On the other hand, if a normal signal abruptly appears at the output of the second amplifier 8 when there is developed no abnormal signal or a noise component, it is suppressed by the AGC circuit 14 before the Schmidt trigger can operate to close its gate 13. While the AGC circuit 14 performs gain control for the second amplifier 8, it also performs gain control for the first amplifier 3, so, part of its output is connected to the input of the AGC circuit 5. Hence, a high frequency signal developed at detuned time, for example, a wave distortion, is suppressed.

FIG. 2 shows waveforms relating to the operation of the noise detecting circuit set forth in FIG. 1; (a) is the waveform of an incoming signal that contains noise; (b)

is a waveform showing the output voltage of the AGC circuit 14 to which the output of the second amplifier 8 is not inputted at the time of noise detection because the second gate circuit 13 is broken; (c) is the waveform of a switching pulse generated by the Schmitt trigger circuit 9 at the time of noise detection. All these waveforms show the possibility of detecting a continuous noise signal having various levels of amplitude. The waveforms identified as (a'), (b') and (c') relate to the case where the second gate circuit 13 is omitted from FIG. 1; (a') shows a waveform corresponding to that described in (a); (b') is a waveform representing the output voltage of the AGC circuit 14 that also operates at noise detection time; and (c') is the waveform of a switching pulse generated by the Schmitt trigger circuit 9. As the waveform (c') clearly shows, when a continuous noise signal having various levels of amplitude exits, a lower level of noise signal cannot be detected.

Figure 3:
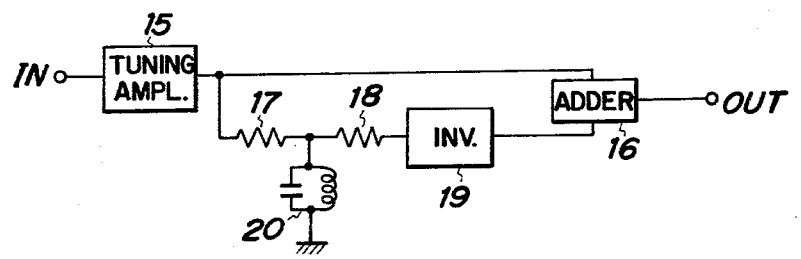
FIG. 3 shows a circuit which replaces the amplifier and adjacent components used in an AM receiver by the components which would be used in the invention in an FM receiver.
Figure 5:
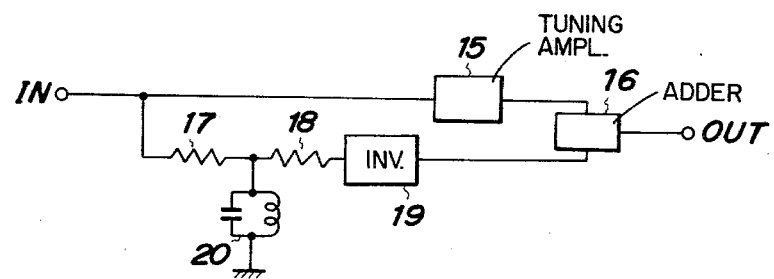
FIG. 5 shows a variation of FIG. 3.

An application of the circuit shown in FIG. 1 to an FM receiver is shown in FIGS. 3, and 5. FIG. 3 shows the circuit components which would replace the amplifier 3 and adjacent components used in an AM receiver for those to be used in an FM stereo receiver. These circuits detect noise in the presence of a frequency component in the neighborhood of the 19 KHz pilot tone.

Referring to FIG. 3, the output of a 19 KHz signal tuning amplifier circuit 15 is branched into first and second signal paths. The first signal path is connected to the first input of an adder circuit 16. The second signal path is connected to the input of a phase inverter circuit 19 through resistors 17 and 18 used for determining a time constant. The output of the phase inverter circuit 19 is connected to the second input of the adder circuit 16. In the second signal path, a 19 KHz parallel resonance circuit 20 is connected between the resistors 17, 18 and the ground.

Figure 4:
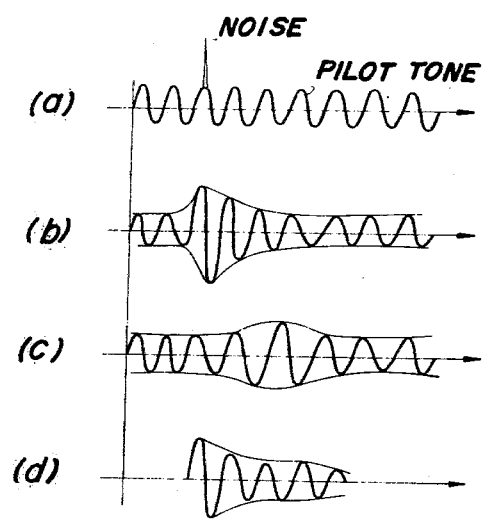
FIG. 4 describes waveforms that illustrate the operation of the amplifier.

FIG. 4 shows signal waveforms that are obtained at various stages of the circuit of FIG. 3. When a pilot tone containing a pulse-shaped noise component as shown in FIG. 4(a) is inputed from the output of a discriminator (not shown) to the 19 KHz tuning amplifier circuit 15, said amplifier circuit 15 detects only the 19 KHz frequency component and a nearby component, so as to output the 19 KHz pilot tone and a 19 KHz component in the noise signal as shown in FIG. 4(b). As already mentioned, the output of the 19 KHz single tuning amplifier circuit 15 is directly supplied to the first input of the adder circuit 16 via the first signal path. The 19 KHz component of the pulse-shaped noise appears as an instantaneous change of amplitude in the first signal path. The output of the 19 KHz single tuning amplifier circuit 15 also passes a tuning circuit having a delay time characteristics formed by the resistors 17 and 18 and the 19 KHz parallel resonance circuit 20, and in this case, the circuit 20 resonates. Therefore, the phase of a pilot tone component is not substantially affected by the tuning circuit and so is in phase with the signal in the first signal path. Because of the existence of a time constant determined by the resistors 17 and 18, the envelope of the pilot tone does not follow a sudden change in noise amplitude and its waveform, as shown in FIG. 4(c), is such that only a changed portion of the envelope shown in FIG. 4(b) is integrated. Thus, a signal having the waveform of FIG. 4(c) is applied to the phase inverter circuit 19. This signal differs from the signal as shown in FIG. 4(b) only it envelopes in a short period around a time when the noise appears and is substantially identical with the signal of FIG. 4(b). The signal of the shape shown in FIG. 4(c) is then made 180° out of phase by the phase inverter circuit 19 and supplied to the second input of the adder circuit 16, where it is added to the signal on the first signal path that is illustrated by FIG. 4(b). In consequence, the pilot tone is cancelled and a change in amplitude of the 19 KHz component of the pulse-shaped noise of the shape shown in FIG. 4(d) is developed at the output of the adder circuit 16. Thus, the rise of a signal appearing at the output of the adder circuit 16 can be used to detect the noise.

FIG. 5 is a variation of the circuit set forth in FIG. 3. Its noise detecting system follows the same theory of operation as in FIG. 3 except that the 19 KHz single tuning amplifier circuit 15 is inserted into the first signal path.

The foregoing explanation relates to the case of detecting a noise component in the neighborhood of the 19 KHz pilot tone that it produced in an FM stereo receiver. However, a noise component in the neighborhood of a stereo sub-signal can also be detected by substituting a 38 KHz single tuning amplifier circuit and a 38 KHz parallel resonance circuit for the 19 KHz single tuning amplifier circuit 15 and the 19 KHz parallel resonance circuit 20, respectively. Further, the noise detecting circuit of this invention is applicable to an AM receiver; that is, a noise component in the vicinity of an intermediate frequency component can be detected by inserting the noise detecting circuit of this invention in the stage next to the mixer and by substituting a 455 KHz single tuning amplifier circuit and a 455 KHz parallel resonance circuit for the 19 KHz single tuning amplifier circuit 15 and the 19 KHz parallel resonance circuit 20, respectively.

Figure 6:
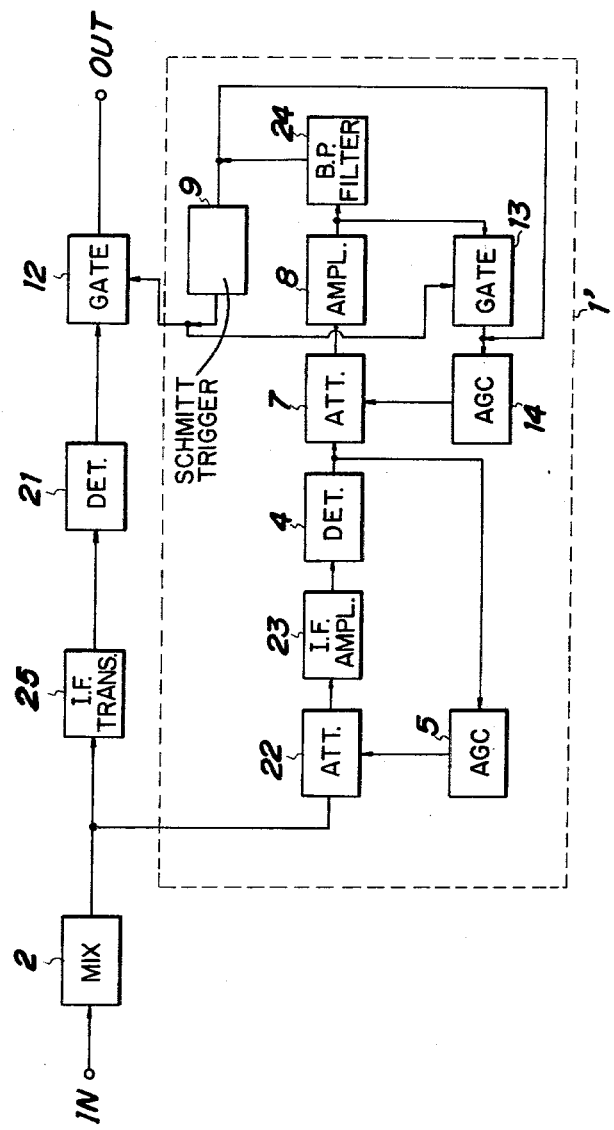
FIG. 6 is a block diagram showing a variation of FIG. 1.

FIG. 6 shows a noise detecting circuit 1' as a variation of FIG. 1. In FIG. 6, those components identified with the same reference numerals as in FIG. 1 represents the counterparts of FIG. 1, and the components added to FIG. 1 are an intermediate frequency transformer 25, a detector circuit 21, an attenuator 22, an intermediate frequency amplifier 23 and a bandpass filter 24.

The embodiment illustrated in FIG. 6 has the following improvements over the circuit of FIG. 1. First, the AGC circuit 5 performs gain control for the intermediate frequency amplifier 23. This is in order to prevent actuation of the Schmitt trigger circuit 9 due to a high frequency signal that is generated when the input signal is sometimes clipped upon saturation of the amplifier 23.

Secondly, this variation includes an audio AGC loop (comprising 8-13-14) and a noise AGC loop (comprising 24-14). When an audio signal does not exist, the lowest level of noise is irritating, but upon application of an audio signal (output of the detector circuit 4), a low level of noise becomes less irritating. Therefore, the function of the audio AGC loop is such that when no audio signal exists in this loop, the AGC circuit 14 does not actuate, and that when an audio signal enters, the circuit 14 actuates if the level of a noise signal is low. Accordingly, erroneous operation due to a high frequency componet of the audio signal is prevented. The function of the noise AGC loop is to prevent discontinuation of audio signals due to continuous operation of the Schmitt trigger circuit 9 caused by continuous application of a high level noise.

As described above, according to this invention, the amplifier for detecting noise is provided with an AGC loop, which is designed not to operate during noise detection period. Therefore, the noise detecting circuit of this invention assures detection of every level of a pulse-shaped noise no matter how high the repeated frequency of noise is, namely, how short the noise interval is. Accordingly, an extremely high sensitive noise detecting circuit is provided by this invention. Moreover, the duration of a switching pulse generated by the noise detecting circuit of this invention exactly corresponds to the period of time during which a noise contained in the incoming signal lasts, and therefore, accurate timing for noise elimination can be obtained.

Further, if the amplifier of FIG. 1 is arranged in the manner described in FIG. 3 or FIG. 5, a noise component very close to the modulated signal frequency component can be detected without error, and so, a remarkable improvement in the noise elimination effect can be realized by this invention.

What is claimed is:

1. In an audio reproducing system including mixer means, intermediate frequency transformer means, first gate means and audio reproducing means following said first gate means, a noise detecting circuit comprising detector means for detecting a high frequency noise component of the output signal of said mixer means; first amplifier means for amplifying a signal having said high frequency component from said detector means; pulse generator means for producing a pulse in response to a noise component in the output of said amplifier means; first automatic gain control means for controlling the gain of said amplifier means; second gate means provided between said automatic gain control means and said first amplifier means; and means for applying said pulse to said first and second gate means to operate them to thereby prevent application of said noise component to said audio reproducing means.

2. A noise detecting circuit according to claim 1 wherein said detector means includes second amplifier means coupled between the output of said mixer means and said first amplifier means and second automatic gain control means for controlling the gain of said second amplifier means, the input of said second automatic gain control means being connected to the output of said first automatic gain control means.

3. A noise detecting circuit according to claim 1 wherein said detector means includes a tuning amplifier, a parallel resonance circuit connected to said tuning amplifier, a phase inverting circuit connected to said parallel resonance circuit, and an adder circuit connected to said tuning amplifier and the phase inverting circuit for adding the output of said tuning amplifier to that of said phase inverting circuit.

4. A noise detecting circuit according to claim 1 further including a bandpass filter means connected between said first amplifier means and said automatic gain control means.

* * * * *